US007969096B2

(12) United States Patent
Chen

(10) Patent No.: US 7,969,096 B2
(45) Date of Patent: Jun. 28, 2011

(54) INDUCTIVELY-COUPLED PLASMA SOURCE

(75) Inventor: Xing Chen, Lexington, MA (US)

(73) Assignee: MKS Instruments, Inc., Andover, MA (US)

( * ) Notice: Subject to any disclaimer, the term of this patent is extended or adjusted under 35 U.S.C. 154(b) by 842 days.

(21) Appl. No.: 11/639,680

(22) Filed: Dec. 15, 2006

(65) Prior Publication Data

US 2008/0142729 A1    Jun. 19, 2008

(51) Int. Cl.
*H05B 31/26*    (2006.01)
(52) U.S. Cl. .......... 315/111.21; 315/111.41; 315/111.51
(58) Field of Classification Search ............ 315/111.21–
111.81; 250/423 R, 424; 219/121.43, 121.54,
219/121.57, 121.59; 156/345.38, 345.48;
204/298.31
See application file for complete search history.

(56) References Cited

U.S. PATENT DOCUMENTS

| | | | |
|---|---|---|---|
| 1,534,251 A | 4/1925 | Smith | |
| 2,039,102 A * | 4/1936 | McArthur | 315/267 |
| 3,291,715 A | 12/1966 | Anderson | |
| 4,431,898 A | 2/1984 | Reinberg et al. | 219/121 PG |
| 4,654,561 A * | 3/1987 | Shelton | 315/111.71 |
| 4,870,030 A | 9/1989 | Markunas et al. | 437/81 |
| 5,122,269 A * | 6/1992 | De Reuver | 210/222 |
| 5,236,747 A | 8/1993 | Dessaux et al. | 427/535 |
| 5,273,609 A | 12/1993 | Moslehi | 156/345 |
| 5,290,382 A | 3/1994 | Zarowin et al. | 156/345 |
| 5,401,350 A | 3/1995 | Patrick et al. | 156/345 |
| 5,423,942 A | 6/1995 | Robbins et al. | 156/643.1 |
| 5,541,385 A | 7/1996 | Konkola | 219/121.6 |
| 5,620,559 A | 4/1997 | Kikuchi | 438/723 |
| 5,654,679 A | 8/1997 | Mavretic et al. | 333/17.3 |
| 5,834,905 A | 11/1998 | Godyak et al. | 315/248 |
| 6,030,506 A | 2/2000 | Bittenson et al. | 204/164 |
| 6,037,562 A | 3/2000 | Awakowicz et al. | 219/121.59 |
| 6,063,233 A | 5/2000 | Collins et al. | 156/345 |
| 6,080,271 A * | 6/2000 | Fujii | 156/345.48 |
| 6,087,778 A | 7/2000 | Benjamin et al. | 315/111.51 |
| 6,107,215 A | 8/2000 | Fujimura et al. | 438/798 |
| 6,150,628 A | 11/2000 | Smith et al. | 219/121.54 |
| 6,156,667 A | 12/2000 | Jewett | 438/715 |
| 6,167,835 B1 | 1/2001 | Ootera et al. | 118/723 E |
| 6,263,831 B1 | 7/2001 | Gorin | 118/723 IR |
| 6,329,297 B1 | 12/2001 | Balish et al. | 438/714 |
| 6,387,288 B1 | 5/2002 | Bjorkman et al. | 216/67 |
| 6,392,351 B1 * | 5/2002 | Shun'ko | 315/111.51 |
| 6,418,874 B1 | 7/2002 | Cox et al. | 118/723 I |
| 6,432,208 B1 * | 8/2002 | Kawakami et al. | 118/728 |
| 6,461,409 B1 | 10/2002 | Neff et al. | 95/78 |
| 6,471,822 B1 * | 10/2002 | Yin et al. | 156/345.49 |
| 6,616,985 B2 | 9/2003 | Powell et al. | 427/562 |
| 6,649,223 B2 | 11/2003 | Colpo et al. | 427/569 |
| 6,762,393 B2 | 7/2004 | Choi | 219/121.36 |
| 6,815,633 B1 * | 11/2004 | Chen et al. | 219/121.54 |

(Continued)

FOREIGN PATENT DOCUMENTS

EP    0908923 A2    4/1999

(Continued)

*Primary Examiner* — Douglas W Owens
*Assistant Examiner* — Tung X Le
(74) *Attorney, Agent, or Firm* — Proskauer Rose LLP

(57) ABSTRACT

A method and apparatus for exciting gas that involves generating an alternating magnetic field unidirectionally through a magnetic core defining a gap, across the gap and through a plasma vessel that includes dielectric material. The magnetic field induces an electric field in the plasma vessel that generates the plasma.

59 Claims, 9 Drawing Sheets

U.S. PATENT DOCUMENTS

| | | |
|---|---|---|
| 6,872,909 B2 | 3/2005 | Holber et al. ............ 219/121.52 |
| 6,975,072 B2 * | 12/2005 | Leung et al. ............ 315/111.21 |
| 7,193,369 B2 | 3/2007 | Min et al. |
| 2002/0029747 A1 | 3/2002 | Powell et al. ............ 118/723 IR |
| 2002/0039625 A1 | 4/2002 | Powell et al. ................ 427/569 |
| 2002/0101167 A1 * | 8/2002 | Shan et al. .............. 315/111.11 |
| 2002/0179248 A1 | 12/2002 | Kabansky ................ 156/345.36 |
| 2003/0006130 A1 | 1/2003 | Colpo et al. .................. 204/164 |
| 2003/0101613 A1 | 6/2003 | Sandhu et al. .................... 34/85 |
| 2004/0071897 A1 | 4/2004 | Verplancken et al. ........ 427/569 |
| 2004/0086434 A1 | 5/2004 | Gadgil et al. ............ 422/186.04 |
| 2004/0206730 A1 | 10/2004 | Holber et al. ............ 219/121.52 |
| 2005/0070073 A1 | 3/2005 | Al-Bayati et al. ............ 438/460 |
| 2007/0035883 A1 * | 2/2007 | Katcha et al. .............. 360/281.8 |
| 2008/0088242 A1 * | 4/2008 | Shun'ko .................. 315/111.51 |

FOREIGN PATENT DOCUMENTS

| | | |
|---|---|---|
| KR | 20050092278 | 9/2005 |
| KR | 20060120968 | 11/2006 |
| KR | 20060127527 | 12/2006 |
| KR | 100743842 | 7/2007 |
| WO | WO 01/11650 | 2/2001 |

* cited by examiner

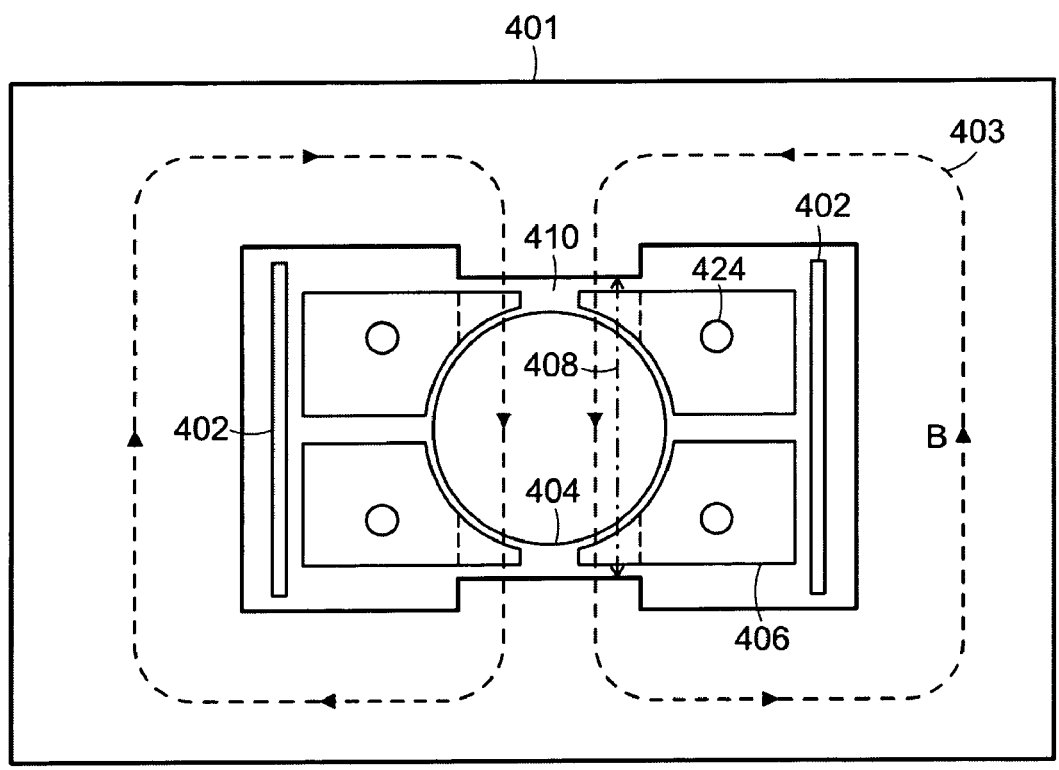
FIG. 4B
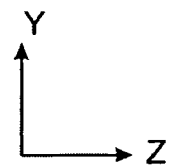

INDUCTIVELY-COUPLED PLASMA SOURCE

FIELD OF THE INVENTION

The invention relates generally to methods and apparatus for generating plasma and exciting gases. More particularly, the invention relates to apparatus and methods for generating excited gases containing ions, free radicals, atoms and molecules and apparatus for and methods of processing materials with excited gases.

BACKGROUND OF THE INVENTION

Plasmas are often used to activate gases placing them in an excited state causing enhanced reactivity. The gases may be excited to produce dissociated gases containing ions, free radicals, atoms and molecules. Excited gases are used for numerous industrial and scientific applications, including processing solid materials such as semiconductor wafers and powders, other gases, and liquids. The parameters of the dissociated gas and conditions under which the dissociated gas interacts with a material to be processed by the system vary widely depending on the application. For example, atomic fluorine is used to etch materials such as Si, $SiO_2$, W, and TiN. Atomic oxygen is used to remove photoresist or other hydrocarbon materials. Ionic and atomic hydrogen can be used to remove oxides of copper and silicon. The amount of power required in the plasma for dissociation to occur may vary depending on, for example, gas flow rates and the specific application for the plasma source.

Plasma sources generate plasmas in various ways. For example, plasma sources generate plasma by applying an electric field in a plasma gas (e.g., $O_2$, $NF_3$, Ar, $CF_4$, $N_2$, $H_2$, and He) or a mixture of gases. Plasma sources may generate a plasma using a DC discharge, microwave discharge, or radio frequency (RF) discharge. A DC discharge generates a plasma by applying a potential between two electrodes in a plasma gas. A microwave discharge generates a plasma by directly coupling microwave energy through a microwave-transparent window into a discharge chamber containing a plasma gas. An RF discharge generates a plasma either by electrostatically or inductively coupling energy from a power supply to a plasma. Electrostatically coupled plasmas, usually having higher ion bombardment energies than inductively coupled plasmas, are typically used in applications where higher ion energy is preferred, or where higher ion energies do not cause any deleterious effects. Inductively coupled plasmas are used in applications where surface bombardment by high energy ions is not desired or where a high plasma density is needed. Inductive and electrostatic coupling often simultaneously occur in an inductively-coupled plasma device, as there is usually a high electric voltage applied to the induction coil and the coil is in close proximity to the plasma. Electrostatic shields may be used between an induction coil and a plasma to prevent or reduce electrostatic coupling. However, electrostatic shields often reduce coupling efficiency between an induction coil and plasma, causing RF power to be wasted and impedance matching to become more difficult. Plasmas are often contained in vessels that are composed of metallic materials such as aluminum, dielectric materials such as quartz or sapphire, or a combination of metallic and dielectric materials.

Conventional plasma sources can be expensive and difficult to maintain. Certain vessel shapes are more expensive and difficult to manufacture. Certain vessel materials, such as sapphire or $Y_2O_3$, are available in limited shapes or geometries. Further, plasma vessels are vulnerable to erosion during operation and must be replaced periodically in conventional systems. This is particularly true when highly reactive ions and atoms of hydrogen, nitrogen, oxygen, fluorine and chlorine are involved.

A need therefore exists for effectively exciting a gas with a plasma in a manner that minimizes the erosion or maximizes the life of the plasma vessel, minimizes the cost associated with manufacturing and using the plasma source, and maximizes plasma stability and gas excitation efficiency.

SUMMARY OF THE INVENTION

One discovery of the present invention is an electromagnetic configuration that can efficiently couple energy to a plasma and maximize gas excitation efficiency while maximizing the life of the vessel. In this electromagnetic configuration, plasmas can be generated in plasma vessels of relatively simple geometries by an induced electromagnetic field without introducing significant electrostatically coupling between the plasma and induction coil. The invention, in one aspect, features a substantially linear plasma vessel that can be used with varying configurations of magnetic cores to efficiently excite a gas and minimize erosion of the vessel containing the excited gas.

The invention, in one aspect, features an apparatus for exciting gases. The apparatus includes a plasma vessel that includes a dielectric material. The apparatus also includes a transformer having a magnetic core defining a gap that generates an alternating magnetic field unidirectionally through the core, across the gap and through the plasma vessel which induces an electric field in the plasma vessel that generates a plasma.

In some embodiments, the apparatus also includes a primary winding surrounding a portion of the magnetic core to carry a current that induces an electromagnetic field. In some embodiments, the apparatus also includes a primary winding surrounding a portion of the plasma vessel to carry a current that induces an electromagnetic field. In some embodiments, the apparatus also includes a power supply in electrical communication with the primary winding that induces the current in the primary winding. The power supply can be, for example, an AC power supply, an AC switching power supply or an RF power supply. In some embodiments, an impedance matching network is connected between the power supply and the primary winding. The primary winding can be located distant from the plasma vessel and coupled to plasma electromagnetically through the magnetic core. The primary winding can also be electrostatically shielded from the plasma vessel to minimize capacitive coupling between the primary winding and the plasma. The plasma vessel can include sapphire, quartz, $Y_2O_3$, SiC, $Si_3N_4$, AlN, BN, $ZrO_2$, alumina or other ceramic materials.

The plasma vessel can be made predominately of a metal material or coated metal material having portions that include a dielectric material to allow a magnetic field to penetrate the plasma vessel. The magnetic field induces an electric field in the plasma vessel that generates a plasma.

The magnetic core can either surround or partially surround the plasma vessel. Different magnetic core configurations, for example, C cores or E cores (e.g., one or more gapped E cores), can be used. In some embodiments, the magnetic core is a plurality of magnetic cores. The plasma vessel can have varying shapes and sizes. In some embodiments, the plasma vessel is a tube. The tube can have different cross sections, for example, a circular cross section, elliptical cross section, a rectangular cross section or a square cross section.

To maximize gas excitation in the tube, a property of the electric field can be varied along a longitudinal axis of the tube. For example, the magnitude of the induced electric field can be varied to maximize gas excitation. A property of the electric field can also be varied in the direction perpendicular to the longitudinal axis of the tube. For example, the magnitude of the induced electric field can be arranged to be higher in the center region of a plasma vessel, so that most plasma is generated in the center region, away from the walls of the plasma vessel. In some embodiments, the apparatus includes a gas inlet. In some embodiments, the gas inlet of the plasma vessel is configured to maximize gas excitation and/or stability of the plasma in the plasma vessel. The gas inlet can be configured to, for example, direct gas along an inner surface of a wall of the vessel.

In some embodiments, the apparatus also includes a cooling system including a plurality of cooling elements in thermal communication with the plasma vessel. In some embodiments, a cooling system is used to control the temperature of the plasma vessel. The cooling system can have one or more channels through which a coolant flows. The cooling system can include a coolant flow controller to manage coolant flow through the channels. In some embodiments, the cooling system is a combination of metal and a high thermal conductivity dielectric material. In some embodiments, the cooling system includes a plurality of cooling elements that are capable of being electrically segmented to distribute and individually control induced electric voltage on each of the cooling elements. In some embodiments, the cooling elements include a combination of rigid segments and compliant segments. The compliant segments can be, for example, thermal heat pads or thermal potting compound. In some embodiments, the apparatus includes a spring-loaded structure that applies a force to the cooling elements. The segmented cooling elements can be electrically biased for igniting the plasma in the plasma vessel. In some embodiments, the apparatus includes a thermal protection circuit with a network of thermal sensors and thermal switches to protect the plasma vessel and the magnetic core from overheating.

Free charges can be generated to assist in ignition of the plasma in the plasma vessel in some embodiments. An electrode positioned in the plasma vessel, an electrode capacitively coupled to the plasma vessel, or an ultraviolet source optically coupled to the plasma vessel can be used to generate free charges which assist in ignition of the plasma in the plasma vessel.

In some embodiments, the apparatus includes a circuit for measuring parameters of the primary winding and the plasma generated by the electric field. The parameters can include current driving the primary winding, voltage across the primary winding, bus voltage, average power in the primary winding, peak power in the primary winding, induced electric field or voltage around the plasma vessel, gas pressure in the plasma vessel, temperatures of the plasma vessel and electronics, or light emissions from the plasma. The parameters are processed through a control circuit that monitors, controls and protects the operation of the apparatus. In some embodiments, the apparatus includes a power control circuit coupled to an output of the circuit for measuring electrical parameters of the primary winding and the plasma. The power control circuit can determine the frequency of the power supply and the current driving the primary winding from a measurement of the electrical parameters of the primary winding and of the plasma and from a predetermined set point representing a desired operating condition.

In some embodiments, the plasma vessel also has an outlet for outputting ions and/or excited gases generated by the plasma to, for example, a process chamber.

In another aspect, the invention relates to a method for exciting gases. The method involves generating an alternating magnetic field unidirectionally through a magnetic core defining a gap, across the gap and through a plasma vessel comprising a dielectric material. The method also involves inducing an electric field in the plasma vessel and generating a plasma.

In some embodiments, the method involves inducing a current in a primary winding surrounding a portion of the magnetic core to generate the magnetic field. An AC power supply, an AC switching power supply or a RF power supply can, for example, be used to induce the current in the primary winding. Capacitive coupling can be minimized between the primary winding and the plasma vessel by, for example, locating the primary winding away from the plasma vessel. The method can involve adjusting a frequency of the power supply with an impedance matching network.

In some embodiments, the method also involves varying a property of the electric field (e.g., magnitude of the induced electric field) along a longitudinal axis of the plasma vessel.

In some embodiments, the method also involves supplying a gas to the plasma vessel via a gas inlet. The method can involve configuring the gas inlet to maximize stability of the plasma in the plasma vessel. In some embodiments, supplying the gas to the plasma vessel involves maximizing gas excitation in the plasma vessel. In some embodiments, supplying the gas involves directing the gas along an inner surface of a wall in the plasma vessel.

In some embodiments, temperature of the plasma vessel is controlled by, for example, positioning a cooling system in thermal communication with the plasma vessel to control the temperature of the plasma vessel.

In some embodiments, the method involves generating free charges in the plasma vessel. In some embodiments, the method involves generating free charges by applying a voltage to a primary winding surrounding the magnetic core. Generating free charges can involve applying a voltage to an electrode in the plasma vessel, capacitively coupling an electrode to the plasma vessel, or optically coupling an ultraviolet source to the plasma vessel.

In some embodiments, the method involves protecting the plasma and magnetic core from overheating by using a thermal protection circuit with a network of thermal sensors and thermal switches.

In some embodiments, the method involves measuring a parameter of the primary winding and of the plasma. In some embodiments, the method involves outputting ions generated by the plasma.

In another aspect, the invention features an apparatus for exciting gases that includes a plasma vessel comprising a dielectric material. The apparatus also includes a transformer comprising a coil that generates an alternating magnetic field unidirectionally through the plasma vessel which induces an electric field in the plasma vessel that generates a plasma.

In another aspect, the invention features an apparatus for exciting gases that has means for generating an alternating magnetic field unidirectionally through a magnetic core defining a gap, across the gap and through a plasma vessel comprising a dielectric material. The apparatus also includes means for inducing an electric field in the plasma vessel to generate a plasma.

In another aspect, the invention features a plasma vessel for use with a gas excitation system. The plasma vessel has an inlet for receiving gas, one or more chamber walls for containing the gas, and an outlet for outputting an activated gas generated by the interaction of the plasma and the gas. The plasma vessel includes a dielectric material that enables a magnetic core having a gap to generate an alternating magnetic field unidirectionally through the core, across the gap, and through the plasma vessel to induce an electric field in the plasma vessel that generates a plasma. In some embodiments, the outlet outputs a noble gas, a reactive gas or a mixture of at least one noble gas and at least one reactive gas.

BRIEF DESCRIPTION OF THE DRAWINGS

The foregoing and other objects, features and advantages of the invention, as well as the invention itself, will be more fully understood from the following illustrative description, when read together with the accompanying drawings, which are not necessarily to scale.

FIG. 4B is a schematic cross-sectional view of the gas excitation system of FIG. 4A according to an illustrative embodiment of the invention.

Figure 1:
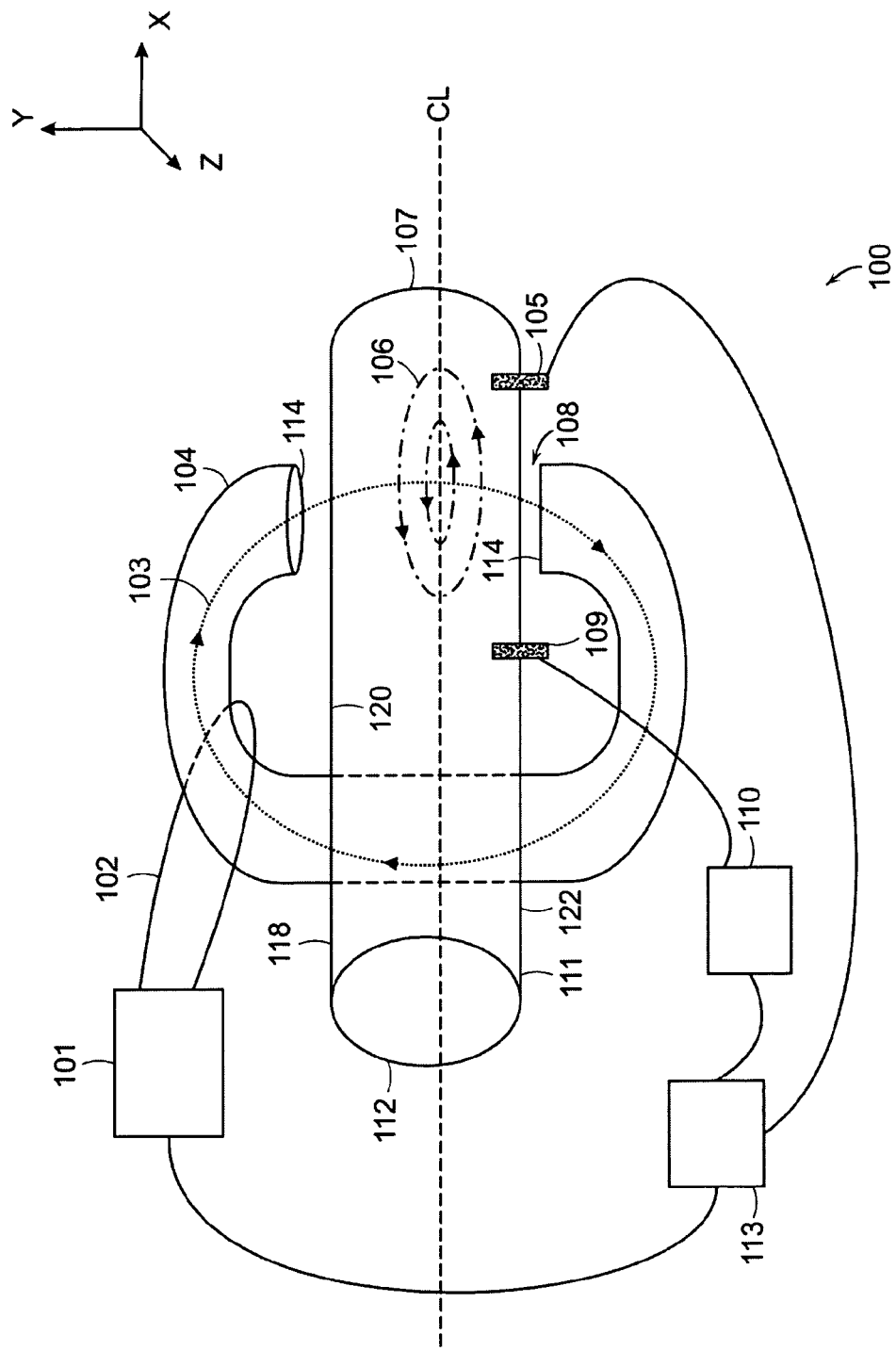
FIG. 1 is a partial schematic view of a system for generating excited gases, according to an illustrative embodiment of the invention.

DETAILED DESCRIPTION OF ILLUSTRATIVE EMBODIMENTS is a partial schematic view of a gas excitation system 100 that generates excited gases, according to an illustrative embodiment of the invention. Plasmas are often used to activate gases, placing them in an excited state such that the gases have an enhanced reactivity. Excitation of a gas involves elevating the energy state of the gas. In some cases, the gases are excited to produce dissociated gases containing ions, free radicals, atoms and/or molecules. The system 100 includes a plasma vessel 111 and at least one magnetic core 104 with a gap 108. The vessel 111 is located at least partially within the gap 108 of the core 104. The system 100 also includes a power supply 101 electrically coupled to a primary winding 102 that surrounds a portion of the magnetic core 104. The power supply 101 provides a flow of electric current through the winding 102 that generates an alternating magnetic field 103 through the core 104. The magnetic field 103 passes through the core 104, unidirectionally at any given time, across the gap 108 and through the vessel 111. The magnetic field 103 induces an electric field 106 in the plasma vessel 111 that generates a plasma from a gas located in the vessel 111. The gas is introduced to the vessel 111 via a gas inlet 112 or other opening in the vessel 111. Excited gas exits the vessel 111 via a gas outlet 107.

In some embodiments, the plasma vessel 111 is linear or a substantially linear structure (e.g., a linear tube). In some embodiments, the plasma vessel 111 is fabricated partially or entirely from a dielectric material (e.g., sapphire or quartz). In this embodiment, the vessel 111 has a circular cross-section when viewed from the gas inlet 112. In some embodiments, the cross section of the vessel 111 is, instead, elliptical, rectangular, square or irregular in shape when viewed from the gas inlet 112. In some embodiments, the vessel 111 is a segment of a toroid or other structure that is not a linear-shaped structure.

In some embodiments, the plasma vessel 111 is made predominately of a metal material or coated metal material having portions that include a region or spacer comprising a dielectric material to allow a magnetic field 103 to penetrate the plasma vessel 111. The vessel 111 is located in a gap of a magnetic core. The magnetic core generates an alternating magnetic field that passes through the dielectric portion of the vessel. The magnetic field induces an electric field 106 in the plasma vessel 111 that generates a plasma.

In the embodiment illustrated in FIG. 1, the magnetic core 104 is a single C-shaped core. Alternative numbers of magnetic cores and configurations of the magnetic core are contemplated in alternative embodiments of the invention. In some embodiments, the magnetic core 104 is, for example, one or more E-shaped cores. In some embodiments, multiple cores 104 are located adjacent to each other, distributed along a lengthwise dimension of the vessel 111. In some embodiments, the cores 104 are rotated relative to each other along, for example, a longitudinal axis of a linear tube such that the respective gaps of the cores 104 do not necessarily align with each other.

In some embodiments, the power supply 101 that drives the primary winding 102 is an AC power supply, AC switching power supply or an RF power supply. The optimal operating frequency of the apparatus depends on characteristic frequencies of the plasma as well as the cost and availability of power supply and magnetic core materials. In some embodiments, the preferred frequencies of the plasma are between about 10 kHz and about 1 GHz. In some embodiments, the primary winding 102 is located distant from the vessel 111 to minimize capacitive coupling between the primary winding 102 and the vessel 111. The winding 102 can be located away from the vessel 111 because with a magnetic core of permeability much greater than that of vacuum, the coupling efficiency is relatively independent of the locations of the primary winding 102. Therefore, it is not required that the winding 102 surround the vessel 111. Alternatively, the winding 102 can be located adjacent to the vessel 111 and be shielded from the vessel 111 by, for example, an electrostatic shield.

In some embodiments, an impedance matching network (not shown) is connected between the power supply 101 and primary winding 102. The impedance matching network contains fixed and adjustable reactive circuit elements (e.g., capacitors and inductors). It also contains one or more sensors (not shown) that either measure the impedance of the load at winding 102 or provide information allowing the impedance to be calculated. The load impedance is fed to the impedance matching network to control the values of the adjustable reactive elements, or to a controller 113 to adjust the frequency of the power supply 101. The impedance sensor can also feed information such as forward and/or reflected power to, for example, the impedance matching network or a user of the system 100. The impedance matching network can be configured to vary the impedance based on the information fed to the impedance matching network. In some embodiments, a user controls the impedance matching network based on the information provided by the impedance sensor.

In some embodiments, the power supply 101 provides pulses of current to the primary winding 102. The pulses of current generate a pulsing magnetic field 103 in the core 104. The pulsing magnetic field 103 induces a pulsing electric field 106 in the plasma vessel 111 that generates a pulsing plasma from a gas located in the vessel 111.

The gas excitation system 100 includes an ignition source 109 that generates free charges in the vessel 111 to assist in the ignition of gas in the plasma vessel 111. In some embodiments, the ignition source 109 that generates free charges in the vessel 111 is an electrode positioned in the vessel 111, an electrode capacitively coupled to the plasma vessel 111, or an ultraviolet source optically coupled to the plasma vessel 111. The ignition source 109 can be located within or partially within the vessel 111. A power supply 110 coupled to the ignition source 109 provides power to the ignition source 109 to ignite the gas or assist in the ignition of the gas in the vessel 111. In some embodiments, no ignition source 109 is provided and, instead, the electric field 106 induced in the vessel 111 by the magnetic field 103 ignites the gas.

The system 100 also includes a sensor 105 that measures parameters of the plasma and the plasma vessel 111. The parameters include, but are not limited to, the magnitude of the induced electric field 106, temperature of the vessel 111, current driving the primary winding 102, voltage across the primary winding 102, bus voltage of the power supply 101 and/or 110, average power in the primary winding 102, peak power in the primary winding 102, temperature of the vessel 111 and/or electronics, plasma light emission, fluctuations in properties of the plasma and gas pressure in the vessel 111. A controller 113 (e.g., a computer processor) is coupled to the power supply 101, the power supply 110 and the sensor 105. Signals generated by the sensor 105 are provided to the controller 113. The controller 113 provides signals to the power supply 101 to command the power supply 101 to provide a flow of current through the winding 102. The controller 113 also is capable of providing signals to the power supply 110 to command the power supply 110 to provide power to the ignition source 109. In this manner, the controller 113 can modify operating parameters of, for example, the power supply 101 and/or 110.

In some embodiments, the controller 113 changes properties of the signals provided to the power supply 101 and/or the power supply 110 in response to the signals provided by the sensor 105 to the controller 113. In some embodiments, no sensor 105 is necessary for operation of the system 100. In some embodiments, other sensors (not shown) are used to monitor operating properties of the system 100. The other sensors provide signals to the controller 113 and the controller 113 modifies operating parameters of the system 100 in response to these signals. The controller 113 can, for example, change the frequency and/or magnitude of the flow of current provided by the power supply 101 to the primary winding 102. In embodiments of the invention where there are multiple cores 104, the controller 113 can, for example, send different signals to one or more power supplies 101 to provide different current signals to each of the multiple cores 104.

In some embodiments, a cooling system (not shown) is in thermal communication with the vessel 111. In some embodiments, the cooling system has one or more cooling elements in thermal communication with the vessel 111. The cooling system has at least one channel through which a coolant, either in a liquid or a gas form, flows. Alternative numbers and configurations of cooling systems, elements and channels are contemplated in alternative embodiments of the invention. In some embodiments, one or more cooling elements are fabricated from a combination of a metal material and a high thermal conductivity dielectric material.

In some embodiments, the cooling elements are formed from a combination of rigid segments and compliant segments. The multiple rigid segments are assembled around vessel 111 with a spring-loaded structure to accommodate thermal expansion and to reduce mechanical stress. A compliant, thermally conductive interface material (e.g., a thermal heat pad) is positioned between the vessel 111 and the cooling element to improve thermal contact. Examples of compliant segment materials include thermal heat pads. An exemplary thermal heat pad is, for example, T-pli 220 series™ gap filler available from Laird Technologies of Cleveland, Ohio. In some embodiments, the cooling elements are thermally bonded to the vessel 111 with a compliant, thermally conductive potting compound (e.g., Stycast 5954 available from Emerson and Cummings, Inc of Canton, Ma. or 3-6655 available from Dow Corning, Inc. of Midland, Mich.) to the vessel 111. The compliant thermal pad or thermal potting compound deforms to the shape of the plasma vessel 111 and the cooling element, thereby providing better thermal contact between the plasma vessel 111 and the cooling element.

In some embodiments, the cooling element is segmented electrically to distribute induced electric voltage on the cooling element. Because the cooling element surrounds the vessel 111 and also surrounds the magnetic field 103, at least one electric break in the cooling element is required to prevent the formation of a circulating current in the cooling element that may shield magnetic field 103 from the plasma vessel 111. Because of the proximity of the cooling element to the vessel 111, an induced voltage on the cooling element can be electrostatically coupled to a plasma in the vessel 111 which can cause ion bombardment and erosion of vessel 111. Segmenting the cooling element electrically into multiple sections reduces the induced voltage on each section, allowing for more uniform distribution of the electric field and reduction of the peak electric field near the plasma vessel surfaces. In one embodiment, the preferred voltage drop between successive cooling element sections is chosen to be between about 20 volts and about 200 volts to avoid ion damage to the surface of the plasma vessel 111.

In some embodiments, resistors or capacitors are connected between the electrically isolated cooling element sections to uniformly distribute the induced electric voltage among the cooling element sections. In some embodiments, the cooling elements are coupled to the impedance matching network. With capacitors connected between the cooling element segments, the cooling elements become a reactive secondary circuit connected in parallel with the plasma in the vessel 111. This reactive secondary circuit changes the impedance of the transformer (i.e., the combination of the primary winding 102, the reactive secondary circuit, and the plasma which form the transformer). The reactance of the reactive secondary circuit can be selected to reduce the current in the primary winding 102. In some embodiments, one or more of the electrically segmented cooling elements are connected to a high voltage source during ignition of the plasma. The electric voltage capacitively couples to the plasma vessel 111 through dielectric walls of the vessel 111 to assist in initial breakdown of the plasma gas.

In some embodiments, the system 100 has a thermal protection circuit (not shown) with a network of thermal sensors and thermal switches that are configured to protect the plasma vessel 111 and the magnetic core 104 from overheating. The thermal protection circuit can, for example, communicate with the controller 113 so the controller 113 varies operating properties of the system 100 based on signals provided by the thermal protection circuit. In some embodiments, the system 100 has a coolant flow controller (not shown) to manage coolant flow. When the system is not in operation, the coolant flow controller reduces the coolant flow through the cooling system to reduce the demand of coolant required from the facility (e.g., semiconductor processing facility).

In some embodiments, the system 100 is configured such that a property of the electric field 106 (e.g., the magnitude of the electric field 106) varies along, for example, a longitudinal dimension of the plasma vessel 111 to maximize gas excitation in the vessel 111. In some embodiments, a higher induced electric field on the inlet 112 side of the plasma vessel 111 is preferred to maintain a uniform and stable plasma, because gas temperature is lower and plasma impedance is higher at the inlet 112 side of the vessel 111. The electric field 106 can be varied or controlled by providing multiple cores 104 with different signals, thereby changing the magnetic field generated by the individual cores 104. By varying the magnetic field of individual cores 104, the electric field produced by the magnetic cores 104 varies in the vessel 111 in proximity to the individual cores 104. Properties of the electric field 106 along the longitudinal dimension of the vessel 111 can also be controlled by varying the size of the gap widths of the individual cores 104 or by varying the number of turns of the primary winding 102 around the individual cores 104.

In some embodiments, the intensity of the induced electric field 106 is varied or controlled in the direction perpendicular to the longitudinal direction of the vessel 111. In some embodiments, it is desirable to generate a plasma in the center of the vessel 111, located away from the walls of the vessel 111 to reduce or eliminate erosion of the plasma vessel 111. This is achieved by concentrating the magnetic field 103 near the center line of vessel 111. Various methods can be used to concentrate the magnetic field 103 along the center line (CL). For example, the poles of the end faces 114 of the magnetic core 104 can be made narrower than the diameter of the vessel 111 or, the poles can be shaped (e.g., tapered) such that the height of magnetic gap 108 is smaller near the center of the end face 114 of the pole relative to the outer edges of the end face 114 of the pole.

In some embodiments, the gas inlet 112 is configured to maximize gas excitation and stability of a plasma in the vessel 111. In some embodiments, the gas inlet 112 directs gas along an inner surface of a wall 120 of the vessel 111 to minimize quenching of the plasma near the gas inlet 112 by the cold inlet gas and to maximize gas excitation. In some embodiments, gas is injected into the vessel 111 at locations on the top 118 and bottom 122 of the vessel 111. The gas migrates towards the center line (CL) of the vessel 111 and in the positive direction along the X-Axis. In this manner, the gas injected into the vessel 111 produces a more uniform plasma load along the longitudinal axis of the vessel 111. In other embodiments, the vessel 111 has multiple gas inlets located along the outer surface of the vessel 111 along the X-Axis.

In some embodiments, one or more dimensions of the vessel 111 are selected to maximize gas excitation in the vessel 111. In some embodiments, the length of the vessel 111 is proportional to the residence time of the gas as it flows through the vessel 111. To excite a gas, a sufficient interaction time between gas molecules and the electrons and ions in the plasma is needed. A longer vessel 111 (along the X-Axis) provides a longer interaction time. However, the length of the vessel 111 cannot be arbitrarily long. The excited gases typically have a short lifetime (less than about 10-100 ms) before the excited gases recombine or decay back to their ground state and lose their reactivity. In some embodiments, it is therefore desirable to balance these two factors by providing a vessel 111 of sufficient length such that a substantial amount of the gas is excited by the plasma, but not too great in length such that the excited gases return to their ground state before they reach the desired location outside of the vessel 111 (e.g., a semiconductor process chamber). In some embodiments, it is therefore desirable to limit the length of the vessel 111 to a length sufficient to excite a substantial amount of the gas injected into the vessel 111. The preferred plasma vessel 111 length for many gas excitation applications is between about 1 cm and about 100 cm.

The size of the vessel 111 along the Y-axis and the Z-axis is related to the size of the gap 108 and the end faces 114 of the magnetic core 104. Each of these facts influence the performance of the system (e.g., gas excitation). At a given current in the primary winding 102, the intensity of the magnetic field 103 in the magnetic gap 108 is inversely proportional to the width of gap 108 (along the Y-axis), because the permeability of the magnetic core 104 is usually much greater than that of vacuum. Each of these factors also influence the performance of the system. For example, a smaller current in the primary winding 102 is required to achieve a specific magnetic field 103 intensity or induced electric field 106 intensity when the width (along the Y-axis) of the magnetic gap 108 is reduced.

In some embodiments, the plasma vessel 111 has an elliptical or rectangular cross section to fit within a relatively narrower magnetic gap 108 width. In some embodiments, the height of the plasma vessel 111 is determined based on the desired size of the plasma as well as the available gas flow. In some embodiments, the preferred height is between about 0.5 cm and about 20 cm. The width of the plasma vessel 111 is also determined by the desired size of the plasma and the available gas flow, and it is typically equal to or larger than the height. In some embodiments, the preferred width of the vessel 111 is between about 1 cm and about 50 cm.

In some embodiments, a plasma is ignited in the plasma vessel 111 when a portion of the gas is directed through a bypass pipeline (not shown). The bypass is disabled after the gas within the plasma vessel 111 has been ignited. A bypass valve (not shown) can be installed in the gas excitation system 100 to enable or disable a portion of the gas to flow through the bypass pipeline. Bypass of all or portion of the gas flow can extend, for example, the range of flow rates and pressure in which a plasma can be successfully ignited. Ignition of the gas in the plasma vessel 111 can be eased by limiting the portion of the flow rate and volume that enters the plasma vessel 111 during ignition. For example, the portion of the flow rate and volume can be as small as zero (i.e., stagnant gas in the plasma vessel 111 is ignited). At the same time, the pressure in the plasma vessel 111 can be the same as the pressure of the gas outside of the plasma vessel 111. For example, the pressure can be a desired operational pressure for use after the plasma is ignited.

In some embodiments, an inert gas, such as argon or helium, is used during plasma ignition. A process gas (e.g., $O_2$, $H_2$ or $NF_3$) is flowed into the plasma vessel 111 after a plasma has been formed. Because the electric field needed to ignite a plasma is typically much higher than the electric field needed to maintain the plasma, the use of an inert gas during ignition reduces the electrical requirements of the gas excitation system 100 and makes the plasma ignition more reliable.

In some embodiments, the gas excitation system 100 generates an activated gas with the plasma in the plasma vessel 111. A portion of the activated gas exits the gas outlet 107. The activated gas interacts with another gas (downstream gas). The activated gas facilitates the dissociation of the downstream gas. This embodiment of the invention is useful where, for example, it is desirable to avoid having the dissociated downstream gas interact with an interior surface of the plasma vessel 111.

In one embodiment, the plasma vessel 111 is made from quartz and the plasma is produced by igniting a mixture of $O_2$ and $N_2$. The activated gas produced by the plasma exits the plasma vessel 111 and interacts with $NF_3$ (downstream gas). In this manner, the $NF_3$ is dissociated through its interaction with the activated gas while minimizing the interaction between the dissociated downstream gas and the interior of the quartz plasma vessel 111.

In some embodiments, the ions, free radicals, atoms and/or molecules generated by the interaction of the plasma with gas introduced to the inlet 112 of the vessel plasma are outputted from the outlet 107 to a process chamber (not shown). In some embodiments, the process chamber is used for, for example, semiconductor processing applications (e.g., etching, thin film deposition, photoresist removal, or wafer cleaning) or for coating or cleaning medical devices. The gas excitation system 100 is useful for cleaning process chambers in semiconductor processing equipment such as thin film deposition and etching systems. The gas excitation system 100 is also useful for providing an ion source for ion implantation and ion milling systems.

In addition, the gas excitation system 100 is useful for providing a source for etching systems used for etching numerous materials used to fabricate semiconductor devices (e.g., materials such as silicon, silicon dioxide, silicon nitride, aluminum, molybdenum, titanium, tungsten and organic materials such as photoresists, polyimides and other polymeric materials). The gas excitation system 100 is also useful for providing a source for plasma enhanced deposition of materials of numerous thin films (e.g., diamond films, silicon dioxide, silicon nitride, and aluminum nitride). The gas excitation system 100 is also useful for generating reactive gases (e.g., atomic fluorine, atomic chlorine, atomic bromine, atomic oxygen, atomic nitrogen, and atomic hydrogen). Such reactive gases are useful for reducing, converting, stabilizing or passivating various oxides (e.g., silicon dioxide, tin oxide, zinc oxide and indium-tin oxide). Applications include fluxless soldering, removal of silicon dioxide from silicon surfaces and passivation of silicon surfaces prior to wafer processing.

Other applications of the gas excitation system 100 include, for example, the modification of surface properties of polymers, metals and ceramics. The gas excitation system 100 may also be used for abatement of environmentally hazardous gases, including fluorine containing compounds such as $CF_4$, $NF_3$, $C_2F_6$, $CHF_3$, $SF_6$, and organic compounds such as dioxins and furans and other volatile organic compounds. In addition, the gas excitation system 100 may be used to generate high fluxes of atomic oxygen, atomic chlorine, or atomic fluorine for sterilization.

The gas excitation system 100 may also be used to process metal bearing gases. For example, the gas excitation system 100 may be used to convert a metal bearing gas to a metallic material, metal oxide material or a metal nitride material. For example, a combination of $O_2$ and $N_2$ can be introduced to the plasma vessel 111 to produce a plasma. $WF_6$ gas can be introduced to the plasma vessel to interact with the plasma to produce a metallic oxide material, $WO_3$. The gas excitation system 100 can be used to produce $U_3O_8$ from the interaction of $UF_6$ with a plasma produced using $O_2$ gas in the plasma vessel 111. The gas excitation system 100 may also be used to process solid materials such as semiconductor wafers, powders, and other gases. In addition, the gas excitation system 100 may be used in atomic layer deposition (ALD) processes, in which the gas excitation system 100 is used to produce atoms or molecules that are, for example, deposited on the surface of a chip.

Figure 2A:
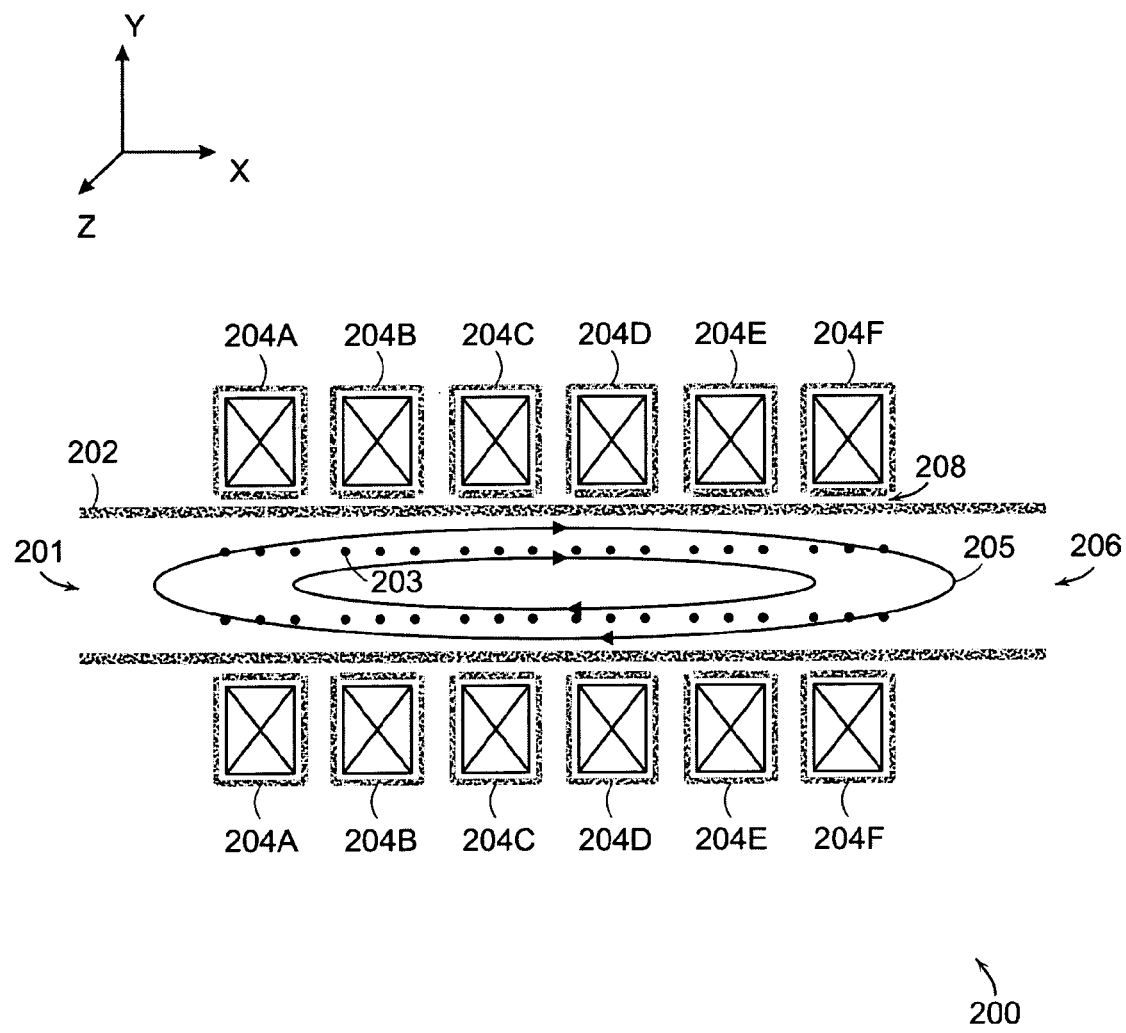
FIG. 2A is a schematic cross-sectional view of a gas excitation system, according to an illustrative embodiment of the invention.
Figure 2B:
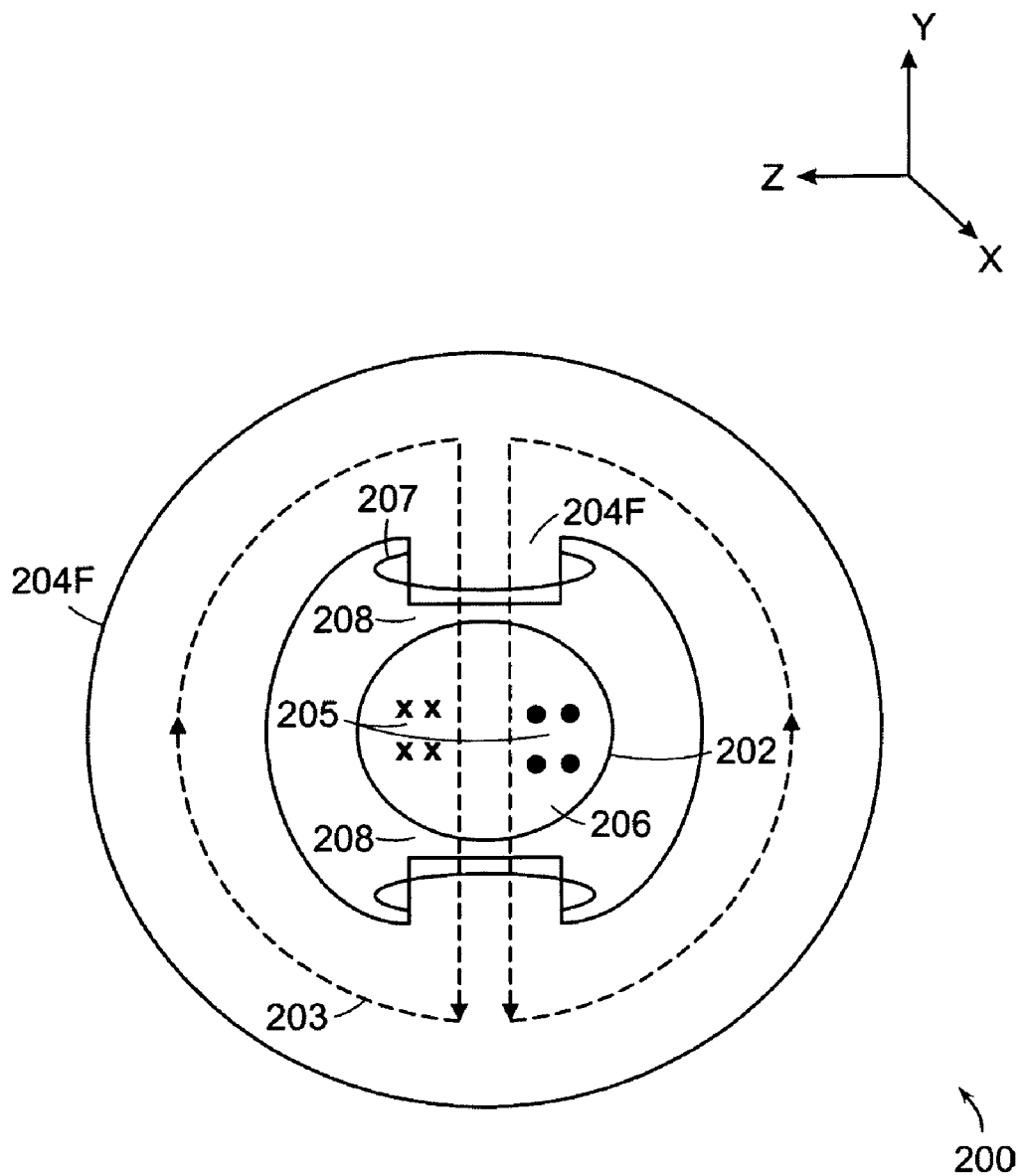
FIG. 2B is an end view of the gas excitation system of FIG. 2A.

FIGS. 2A and 2B are schematic views of the electromagnetic configuration of a gas excitation system 200, according to an illustrative embodiment of the invention. The system 200 has a plasma vessel 202 with six E-shaped magnetic cores 204A, 204B, 204C, 204D, 204E and 204F (generally 204) each with a gap 208. The plasma vessel 202 is located at least partially within the magnetic gap 208 of the cores 204. A current flowing in a primary winding 207 that surrounds a portion of each core 204 generates a magnetic field 203. The magnetic field 203 passes through the core 204, unidirectionally at a given time, across the gap 208, and through the vessel 202 as illustrated in FIG. 2B. The magnetic field 203 induces an electric field 205 in the vessel 202 that generates a plasma from a gas located in the vessel 202. Gas is introduced to the vessel 202 via a gas inlet 201. The plasma located in the vessel 202 excites the gas and exits the vessel 202 via a gas outlet 206.

In this embodiment, the plasma vessel 202 is a linear or substantially linear tube. In some embodiments, the plasma vessel 202 is fabricated partially or entirely from a dielectric material (e.g., sapphire, quartz, $Y_2O_3$, SiC, $Si_3N_4$, AlN, BN, $ZrO_2$, or alumina). In this embodiment, the vessel 202 has a circular cross section when viewed from the gas inlet 201. In some embodiments, the cross section of the vessel 202 when viewed from the gas inlet 201 is, instead, elliptical, rectangular, square, or irregular in shape.

In some embodiments, the magnetic core 204 is one or more C-shaped cores. Alternative numbers, types and configurations magnetic cores 204 are contemplated in alternative embodiments of the invention.

In some embodiments, a power supply (e.g., the power supply 101 of FIG. 1) is electrically coupled to the primary winding 207 that surrounds a portion of the magnetic core 204. The power supply provides a flow of current through the winding 207 which generates the magnetic field 203 through the core 204. In some embodiments, the power supply that drives the primary winding 207 is an AC power supply, AC switching power supply or an RF power supply. In some embodiments, the primary winding 207 is located distant from the vessel 202 (e.g., along the Y-Axis) to minimize capacitive coupling between the primary winding 207 and the vessel 202.

In some embodiments, the gas excitation system 200 has at least one ignition source that generates free charges in the vessel 202 to assist in the ignition of gas in the plasma vessel 202. In some embodiments, the ignition source is an electrode positioned in the vessel 202, an electrode capacitively coupled to the plasma vessel 202, or an ultraviolet source optically coupled to the vessel 202. A power source coupled to the ignition source provides power to the ignition source to assist in the ignition of gas. In some embodiments, no ignition source is provided and, instead, a high magnetic field 203 induces the electric field 205 and ignites the gas in the vessel 202.

In some embodiments, the system 200 also includes a sensor that measures electric parameters (e.g., the magnitude of the electric field 205) of the plasma in the vessel 202. In some embodiments, a controller is coupled to the power supply that provides current to the primary winding 207, the power supply that provides power to the ignition source, and the sensor. In some embodiments, the controller varies the operation of these components of the system based on the electric parameters of the system 200 that are monitored. In this manner, a closed-loop feedback system is created that controls the operation of the system 200. In some embodiments, no sensor is included in the system 200.

In some embodiments, a cooling system is in thermal communication with the vessel 202. The cooling system or components of the cooling system (e.g., a plurality of cooling elements) has at least one channel through which a coolant flows. Alternative numbers and configurations of cooling elements and channels are contemplated in alternative embodiments of the invention. In some embodiments, the cooling element is a combination of metal and high thermal conductivity dielectric material. In some embodiments, the cooling elements are electrically segmented to reduce induced electric voltage on the cooling elements. In some embodiments, the system 200 has a thermal protection circuit with a network of thermal sensors and thermal switches that protects the plasma vessel 202 and the magnetic core 204 from overheating during operation.

Figure 3:
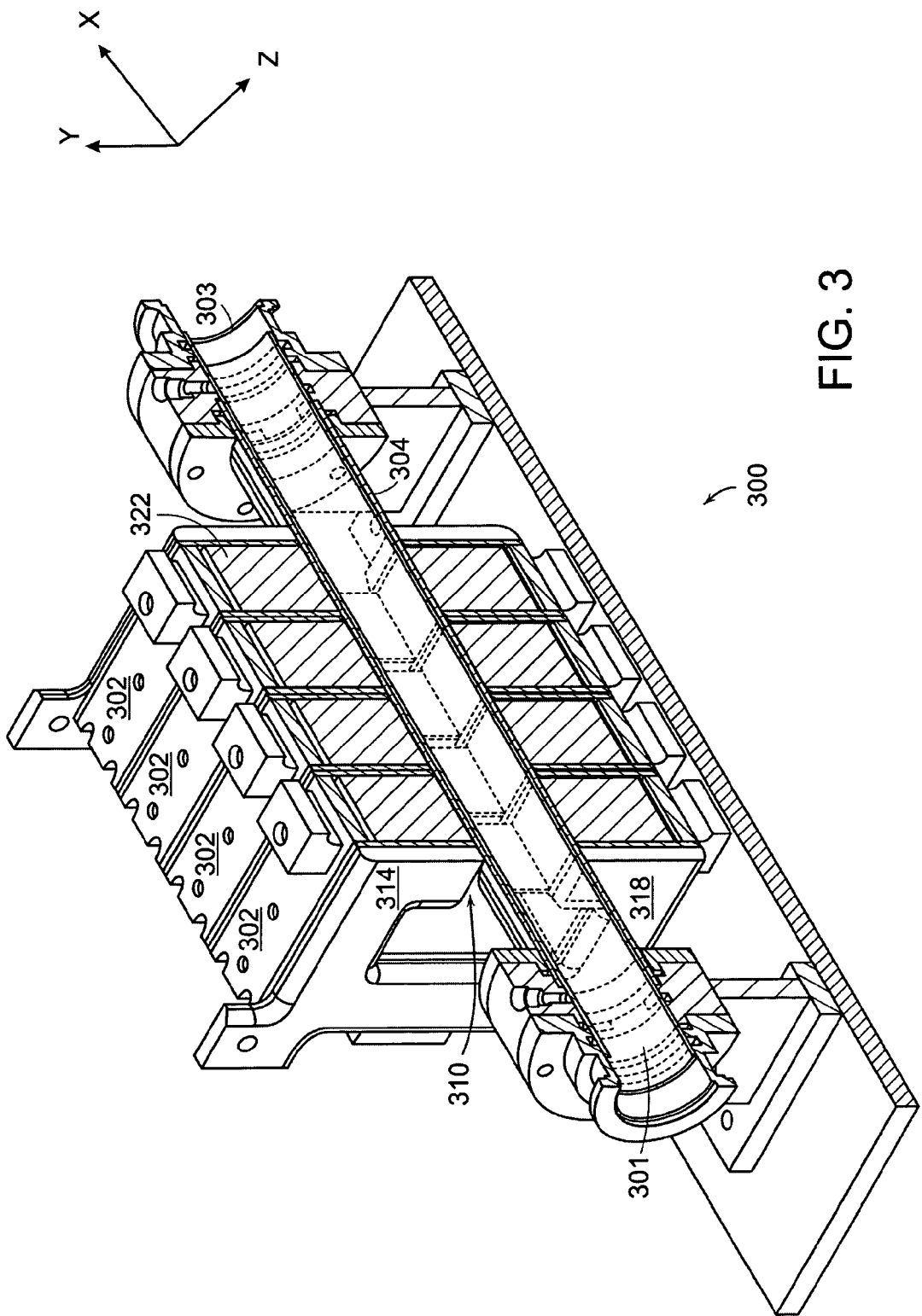
FIG. 3 is a cross-sectional, three dimensional view of a gas excitation system, according to an illustrative embodiment of the invention.

FIG. 3 is a cross sectional, three dimensional view of a gas excitation system 300, according to an illustrative embodiment of the invention. The system 300 has a plasma vessel 304 with eight C-shaped magnetic cores 302 (only four of the C-shaped magnetic cores 302 are shown for clarity of illustration purposes) with a gap 310 between opposing portions 314 and 318 of the cores 302. The four magnetic cores 302 not shown in FIG. 3 are located such that their end faces 322 abut the end faces 322 of the four magnetic cores 302 that are shown in FIG. 3 (forming four pairs of magnetic cores 302). The vessel 304 is located at least partially within the gap 310 of the cores 302. The four pairs of cores 302 are adjacent each other and distributed along the X-axis of the vessel 304.

Similarly as previously described herein, a power supply induces a flow of current in a primary winding that surrounds a portion of the cores 302. The flow of current generates an alternating magnetic field that passes unidirectionally through the cores 302, across the gap 310, and through the vessel 304. The magnetic field induces an electric field in the vessel 304 that generates a plasma from a gas located in the vessel 304. The gas is introduced to the vessel 304 via a gas inlet 301 and excited by the plasma located in the vessel. The excited gas exits the vessel 304 via a gas outlet 303. In this embodiment, the plasma vessel 304 is a linear tube. In some embodiments, the cross section of the gas inlet 301 or gas outlet 303 is instead elliptical, rectangular, square or irregular in shape.

Figure 4A:
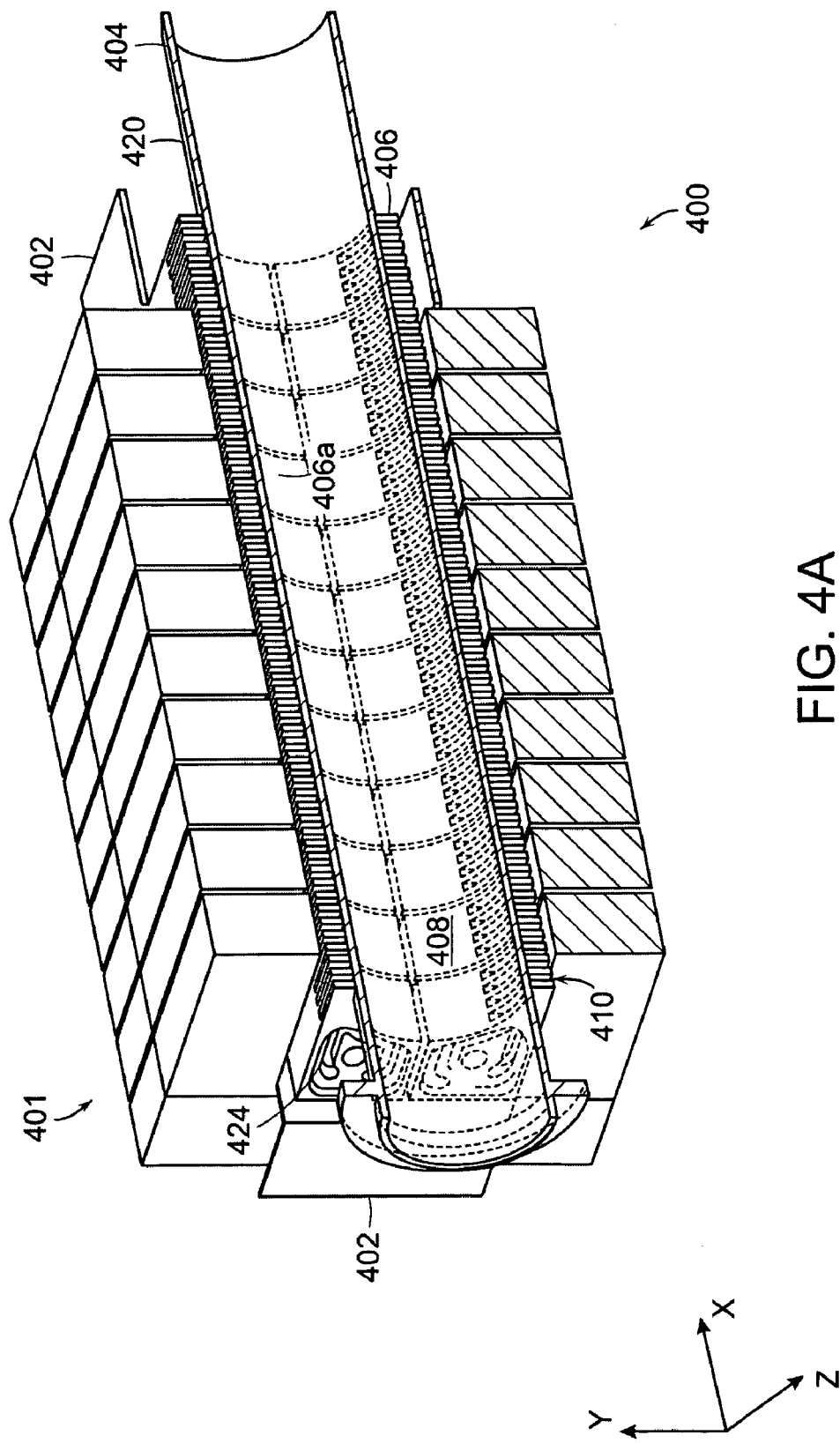
FIG. 4A is a cross-sectional, three dimensional view of a gas excitation system, including a cooling system, according to an illustrative embodiment of the invention.

FIG. 4A is a cross-sectional view of a gas excitation system 400, according to an illustrative embodiment of the invention. The system 400 includes a plurality of rectangular-shaped magnetic cores 401 that surround a plasma vessel 404. The system 400 also includes a cooling system 406 assembled from a plurality of components that are disposed around an outer surface 420 of the plasma vessel 404 to remove heat from a plasma located in the vessel 404. A power supply (not shown) induces a flow of current in a primary winding 402. The primary winding 402 is located inside the opening of the magnetic cores 401 and loops around the plasma vessel 404 and its cooling structure 406 (see FIGS. 4A and 4B). The current in the primary winding 402 generates a magnetic field 403 in FIG. 4B, through the magnetic cores 401, across the gap 408 and through the plasma vessel 404. The magnetic field 403 induces an electric field in the plasma vessel 404 that generates a plasma. In this embodiment, the primary winding 402 is a flat sheet or plate of conductive metal. Alternatively, the primary winding 402 can have various cross sections and/or multiple turns.

The cooling system 406 consists of a plurality of metal cooling blocks or elements that are electrically segmented (no electrical conductive path between adjacent cooling elements). Because the cooling elements are electrically isolated from each other, it is possible to control the distribution of induced electric voltage on the cooling system 406 with a set of resistors or capacitors connected between the cooling elements of the cooling system 406.

FIG. 4B is a cross sectional view (in the Y-Z plane) of the system 400 illustrating the cores 401 and the induced magnetic field 403. The electric voltage on the primary winding 402 is electrostatically shielded from the plasma vessel 404 because the cooling system 406 is located between the primary winding 402 and the plasma vessel 404. The cooling system 406 consists of a plurality of metal cooling blocks or elements that are mechanically segmented. In FIG. 4B, the cooling elements are shown as being segmented into four quadrants that are located generally circumferentially around the plasma vessel 404. The mechanical precision required to match the cooling elements to the plasma vessel is reduced because each of the four quadrants can individually align with the plasma vessel.

Figure 4C:
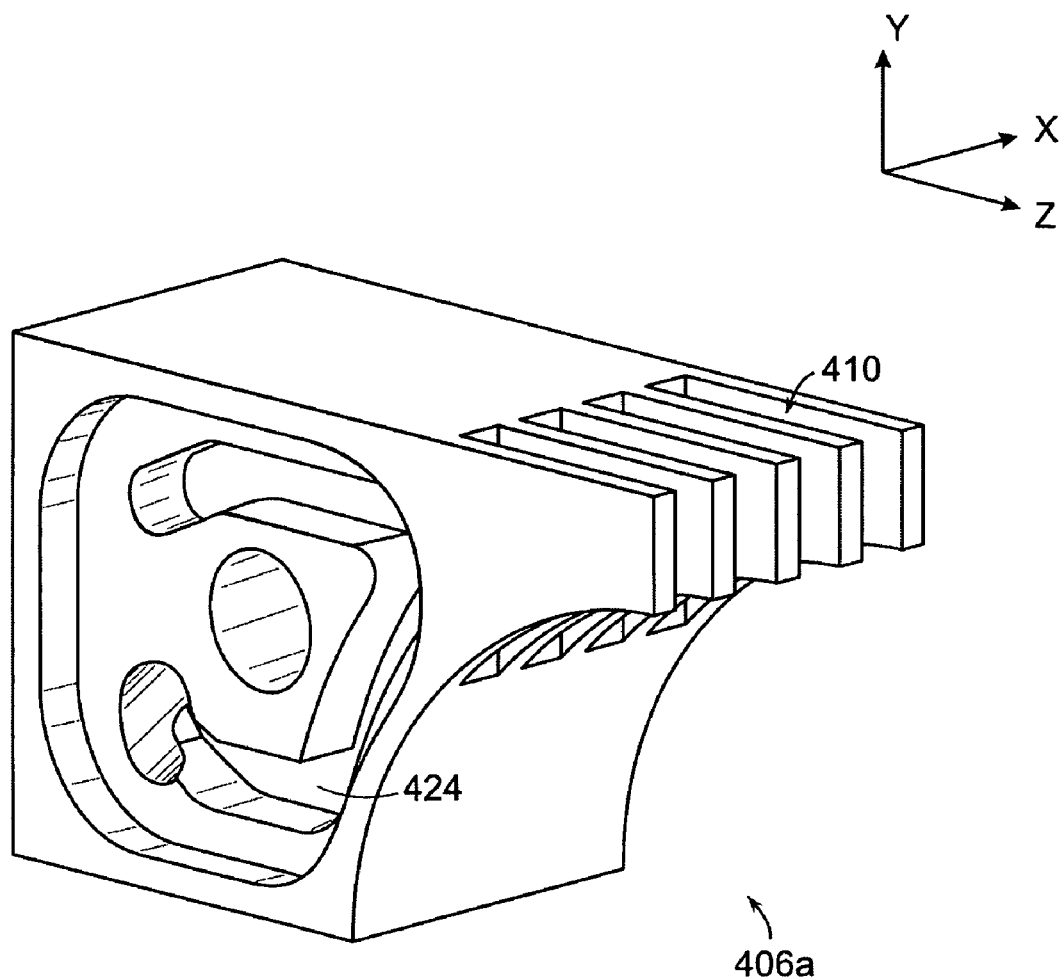
FIG. 4C is a three dimensional view of a cooling element of FIG. 4A, according to an illustrative embodiment of the invention.

FIG. 4C illustrates a single cooling element 406a, according to an illustrative embodiment of the invention. Channels 424 are passages in the cooling element 406a that transport cooling fluid. The cooling elements 406a are located adjacent to each other aligned along the X-Axis and aligned in the Y-Z plane to allow the cooling fluid to flow from one cooling element 406a to another. Slotted openings 410 are made on the cooling elements 406a. The openings 410 are aligned with the magnetic field 403 direction to allow magnetic flux to pass through the openings 410 in the cooling system 406 and into the plasma vessel 404. The cooling elements 406a may be made from, for example, a metal such as copper, brass, or aluminum.

In some embodiments the cooling elements 406a are made from a thermally conductive dielectric material (e.g., AlN or BN). The cooling elements 406a are assembled around the vessel 404 with a spring-loaded structure (not shown) to accommodate thermal expansion and to minimize mechanical stress on the plasma vessel 404. The spring loaded structure applies a force to an outer surface of the cooling elements 406a to maintain sufficient contact between the cooling elements 406a and the plasma vessel 404 to ensure that the thermal energy will be transferred from the vessel 404 to the cooling elements 406a. The cooling fluid passing through the channels 424 conducts heat away from the cooling elements and away from the system 400. In some embodiments, the cooling fluid is then cooled and recycled back into the system 400. A compliant, thermally conductive interface material (e.g., a thermal pad or thermally-conductive potting compound) is positioned between the vessel 404 and the cooling elements 406 to improve thermal contact between the vessel 404 and the cooling elements 406. Resistors or capacitors may be connected between the electrically isolated cooling elements (i.e., between adjacent cooling elements 406a) to uniformly distribute the induced electric voltage among the cooling elements 406a. In some embodiments, an additional cooling system is provided to remove heat from the magnetic cores 401 and the primary winding 402.

In some embodiments, the primary winding 402 is segmented with each segment connected through capacitors to the power supply (e.g., the power supply 101 of FIG. 1), producing the electric equivalent of a serial LC circuit. By varying the impedance of the LC circuit, it is possible to reduce the apparent impedance of the primary winding 402 and to reduce the electric voltage on the primary winding 402 at a given primary current. The lower electric voltage on the primary winding 402 decreases electrostatic coupling between the primary winding 402 and the plasma vessel 404 and reduces the amount of insulation required for the primary winding 402. The impedance of the LC circuit can be modified by, for example, varying the capacitance of the capacitors or by altering the physical and/or electric properties of the primary winding 402.

Figure 5:
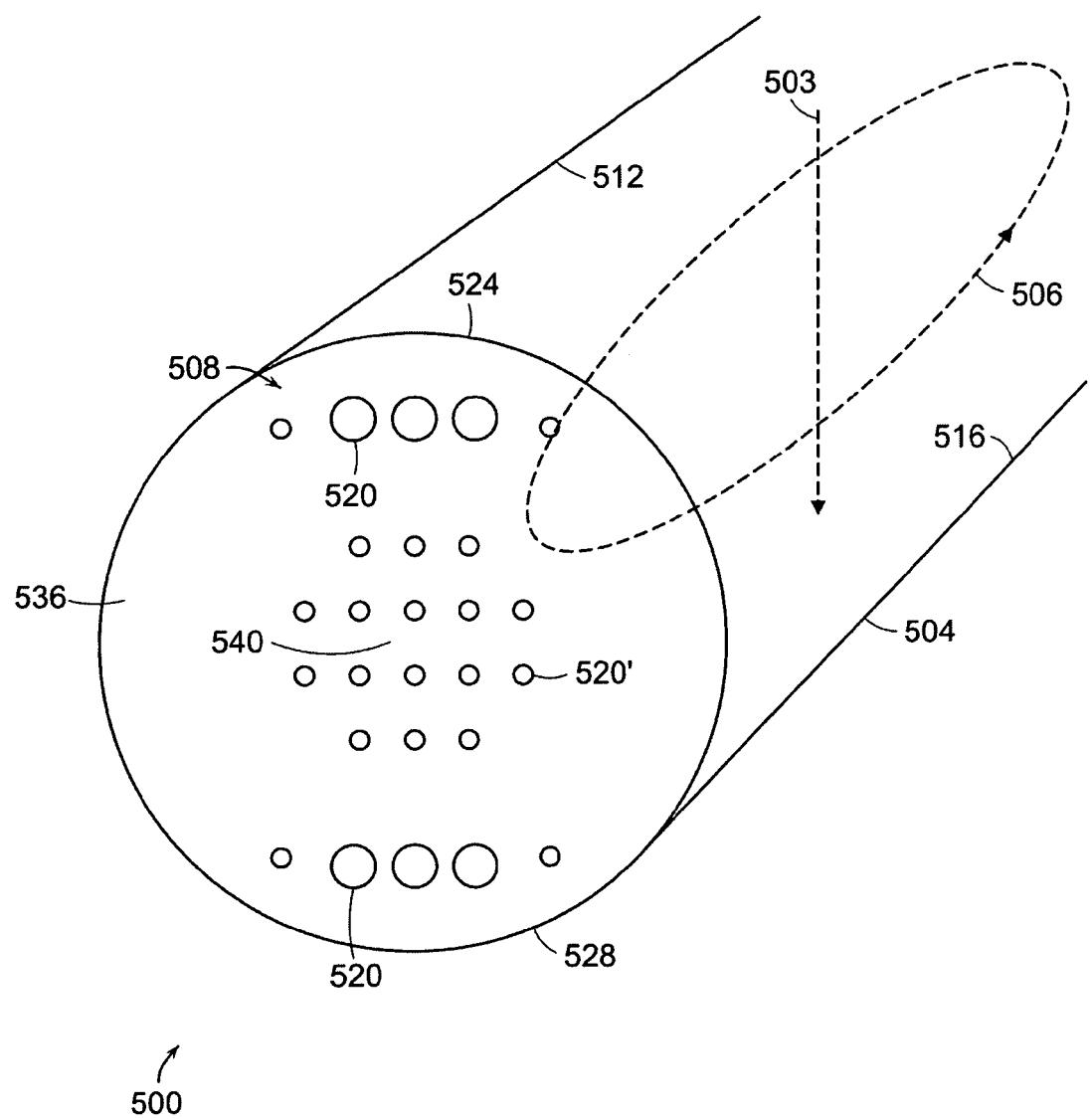
FIG. 5 is a partial schematic view of a gas inlet of a gas excitation system, according to an illustrative embodiment of the invention.

In some embodiments, the gas inlet of the plasma vessel is configured to maximize gas excitation and stability of a plasma in the plasma vessel. FIG. 5 is a partial schematic view of a gas inlet 508 of a plasma vessel 504 of a gas excitation system 500, according to an illustrative embodiment of the invention. The gas inlet 508 is designed such that a majority of gas is injected through openings 520, along top 512 and bottom 516 inner surfaces of the plasma vessel 504. The larger openings 520 at the top 524 and bottom 528 of the gas inlet 508 enable more gas to be injected along the top 512 and bottom 516 inner surfaces of the vessel 504. By introducing more gas into the vessel 504 along the top 512 and bottom 516 inner surfaces (rather than through the center 540 of the gas inlet 508), the gas is less likely to quench the plasma because it gradually interacts with and mixes with the plasma. By controlling gas injection, a more uniform plasma load is achieved in the longitudinal direction of the vessel 504. This improves plasma stability and increases the maximum gas flow that can be used in the plasma source as compared to injecting gas uniformly over the face 536 of the gas inlet 508. The small holes 520' in the center of the face 536 of the gas inlet 508 allow some gas to enter the vessel 504 and prevents overheating of the gas inlet 508 by the plasma.

Figure 6:
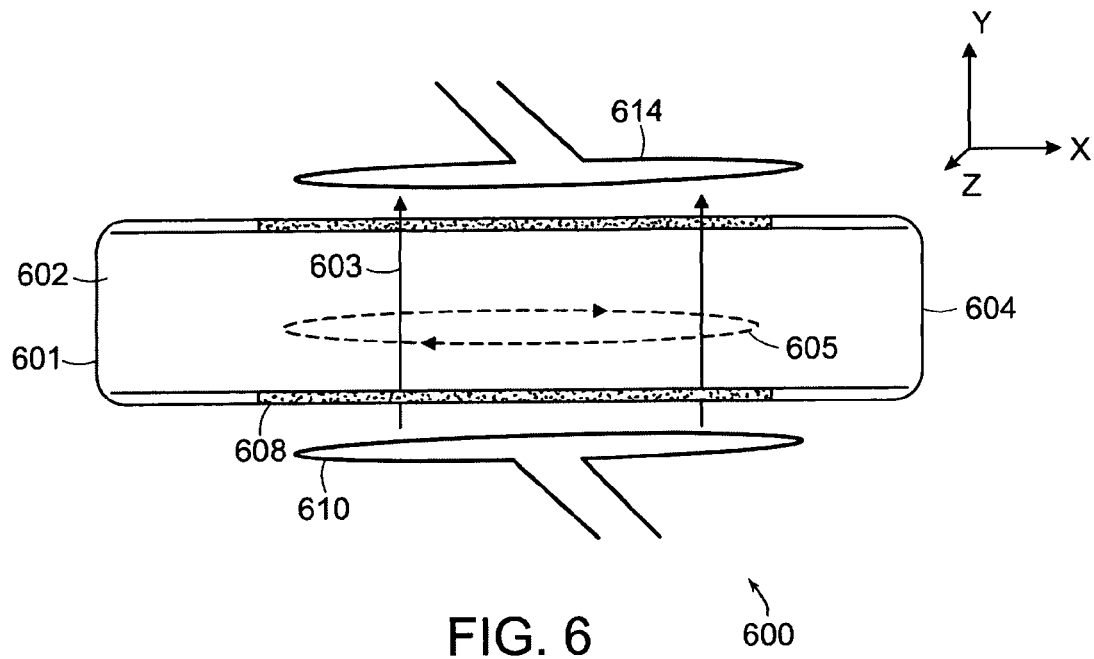
FIG. 6 is a partial schematic view of a gas excitation system without a ferrite core, according to an illustrative embodiment of the invention.

FIG. 6 is a partial schematic view of a gas excitation system 600, according to an illustrative embodiment of the invention. The plasma source 600 includes a plasma vessel 602 and windings 610 and 614. The vessel 602 is located between the windings 610 and 614. A power supply (not shown) induces a current in the windings 610 and 614. The currents flowing through the windings 610 and 614 are in the same direction and phase. The magnetic field 603 passes unidirectionally from winding 610 towards winding 614 and through the vessel 602. The magnetic field 603 induces an electric field 605 in the plasma vessel 602 that generates a plasma from a gas located in the vessel 602. No magnetic core is required in this embodiment of the invention. The elimination of a magnetic core increases the magnetic path length. A high primary current is therefore required to achieve a given induced electric field. The embodiment is advantageous when the plasma power level is relatively low (less than 100-1000 W) or when it is necessary or desirable to operate the gas excitation system at frequencies that are too high for a magnetic core to be effective. The operating frequencies can be from about 100 kHz to about 1 GHz. The gas is introduced to the vessel 602 via a gas inlet 601 and the excited gas exits the vessel 602 via a gas outlet 604. The plasma vessel 602 is a partially or substantially dielectric material 608 (e.g., sapphire or quartz). In this particular embodiment, the plasma vessel 602 is partially dielectric, allowing the magnetic field 603 to pass through the vessel 602 in the region labeled 608. In some embodiments, cooling and electrostatic shielding arrangements (not shown) may be provided to the plasma vessel 602 to remove the heat from the plasma vessel 602 and to reduce electrostatic coupling between the plasma vessel 602 and windings 610 and 614, similarly as described herein (e.g., with respect to FIGS. 4A, 4B, and 4C). In some embodiments, the gas inlet 601 of the plasma vessel 602 is configured to maximize gas excitation and stability of the plasma in the plasma vessel, similarly as described herein (e.g., with respect to FIG. 5).

Figure 7:
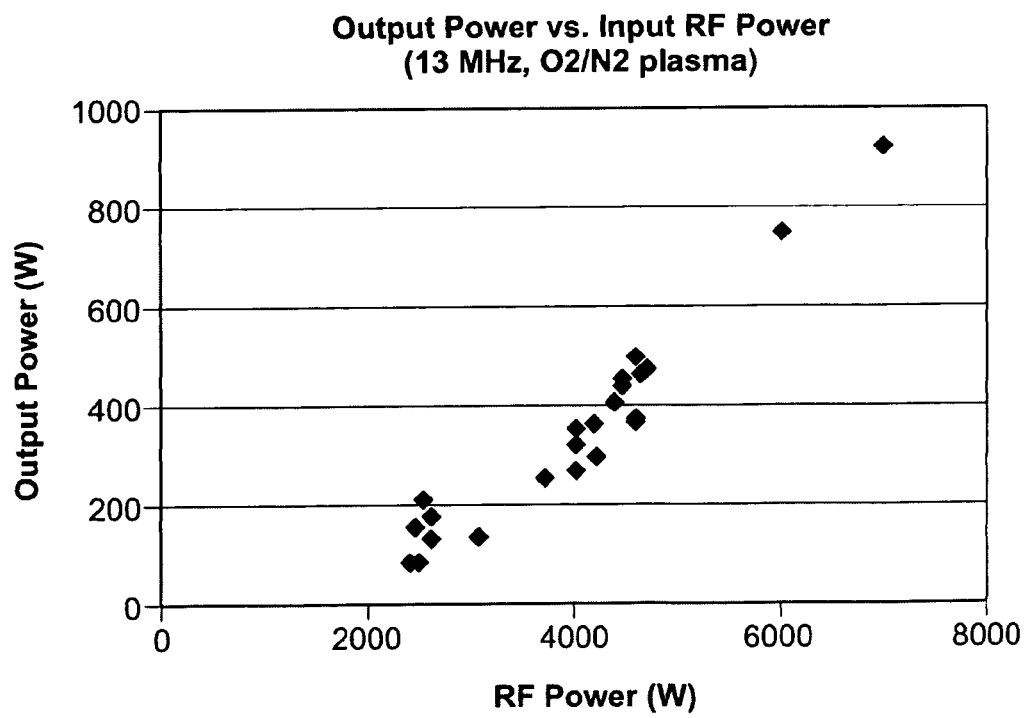
FIG. 7 is a graphical representation of output power as a function of the input RF power, using a gas excitation system according to an illustrative embodiment of the invention.

By way of illustration, an experiment was conducted to dissociate $O_2$. A combination of $O_2$ and $N_2$ ($O_2$ plus 10% $N_2$) was introduced into the inlet 301 of the vessel 304 of FIG. 3. In this experiment, the inlet gases were dissociated by their interaction with a plasma in the vessel 304, producing an outlet gas, in which a significant amount of chemical energy is stored in the outlet gas as atomic oxygen and nitrogen. In some embodiments, this chemical energy can be much higher than the thermal energy carried in the gas. For example, the bonding energy (i.e., chemical energy) of an $O_2$ molecule is 5.2 electron volts (eV). When a molecule is at 2000 C, its thermal energy is only about 0.2 eV. In this experiment, power measurement was conducted to measure the energy in the output gas using a recombination calorimeter. FIG. 7 illustrates a plot of the measured power in the output gas as a function of the input RF power. The measured output power in the gas is about 950 W for an input power of 7 kW at a gas flow rate of 6 standard liters per minute (slm) of $O_2$ and 0.6 slm of $N_2$. This data was taken with the power supply (e.g., the power supply 101 of FIG. 1) operating at an RF frequency of 13.56 MHz. Similar results are obtained at RF frequencies of 400 kHz and 500 kHz.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. An inductively-coupled plasma source for exciting gases comprising:
   a. a plasma vessel comprising a dielectric material; and
   b. a transformer comprising a magnetic core defining a gap that generates an alternating magnetic field unidirectionally through the core, across the gap and through the plasma vessel which induces an electric field in the plasma vessel that generates a plasma.

2. The apparatus of claim 1, comprising a primary winding surrounding a portion of the magnetic core or the plasma vessel to carry a current that induces an electromagnetic field.

3. The apparatus of claim 2, comprising a power supply in electrical communication with the primary winding to induce the current in the primary winding.

4. The apparatus of claim 3, wherein the power supply is an AC power supply, an AC switching power supply or an RF power supply.

5. The apparatus of claim 3, comprising an impedance matching network connected between the power supply and the primary winding.

6. The apparatus of claim 2, wherein the primary winding is located distant from the plasma vessel or is electrostatically shielded from the plasma vessel to minimize capacitive coupling between the primary winding and the plasma.

7. The apparatus of claim 2, comprising a circuit for measuring parameters of the primary winding and the plasma generated by the electric field, the parameters including one or more of a current driving the primary winding, a voltage across the primary winding, a bus voltage, an average power in the primary winding, a peak power in the primary winding, a magnitude of the electric field, a temperature of the vessel, a current in the plasma, a plasma light emission, a fluctuation in the plasma, and a gas pressure in the vessel.

8. The apparatus of claim 7, comprising a power control circuit coupled to an output of the circuit for measuring electrical parameters of the primary winding and the plasma, the power control circuit determining the frequency of the power supply and the current driving the primary winding from a measurement of the electrical parameters of the primary winding and of the plasma and from a predetermined set point representing a desired operating condition.

9. The apparatus of claim 1, wherein the dielectric material comprises sapphire, quartz, $Y_2O_3$, SiC, $Si_3N_4$, AlN, BN, $ZrO_2$, alumina, or a ceramic material.

10. The apparatus of claim 1, wherein the magnetic core partially surrounds the plasma vessel.

11. The apparatus of claim 10, wherein the magnetic core is a C core.

12. The apparatus of claim 1 wherein the magnetic core is a plurality of magnetic cores.

13. The apparatus of claim 1, wherein the magnetic core surrounds the plasma vessel.

14. The apparatus of claim 13, wherein the magnetic core is a pair of gapped E cores.

15. The apparatus of claim 1, wherein the plasma vessel comprises a tube.

16. The apparatus of claim 15, wherein the tube comprises a circular cross section, elliptical cross section, a rectangular cross section or a square cross section.

17. The apparatus of claim 15, wherein a property of the electric field varies along a longitudinal axis of the tube to maximize gas excitation in the tube.

18. The apparatus of claim 17, wherein the property is the magnitude of the electric field.

19. The apparatus of claim 1, comprising a gas inlet.

20. The apparatus of claim 19, wherein the gas inlet is configured to maximize stability of the plasma in the plasma vessel.

21. The apparatus of claim 19, wherein the gas inlet is configured to maximize gas excitation in the plasma vessel.

22. The apparatus of claim 19, wherein the gas inlet is configured to direct gas along an inner surface of a wall of the vessel.

23. The apparatus of claim 1, comprising a cooling system including a plurality of cooling elements in thermal communication with the plasma vessel.

24. The apparatus of claim 23, wherein the cooling elements comprise a combination of rigid segments and compliant segments.

25. The apparatus of claim 24, wherein the compliant segments are thermal heat pads or thermal potting compounds.

26. The apparatus of claim 24, wherein the cooling elements are capable of being electrically biased for igniting the plasma in the plasma vessel.

27. The apparatus of claim 23, comprising a spring-loaded structure that applies a force to the cooling elements.

28. The apparatus of claim 23, wherein the cooling elements are electrically segmented.

29. The apparatus of claim 23, wherein the cooling system comprises at least one channel through which a coolant flows.

30. The apparatus of claim 29, wherein the cooling system comprises a coolant flow controller to manage the coolant flow.

31. The apparatus of claim 23, wherein the cooling system comprises a combination of metal and a high thermal conductivity dielectric material.

32. The apparatus of claim 1, comprising an electrode positioned in the plasma vessel capable of generating free charges which assist in ignition of the plasma in the plasma vessel.

33. The apparatus of claim 1, comprising an electrode capacitively coupled to the plasma vessel capable of generating free charges which assist in ignition of the plasma in the plasma vessel.

34. The apparatus of claim 1, comprising an ultraviolet source optically coupled to the plasma vessel capable of generating free charges which assist in ignition of the plasma in the plasma vessel.

35. The apparatus of claim 1, comprising a thermal protection circuit with a network of thermal sensors and thermal switches to protect the plasma vessel and the magnetic core from overheating.

36. The apparatus of claim 1, wherein the plasma vessel comprises an outlet for outputting at least one of ions and excited gases generated by the plasma.

37. The apparatus of claim 36, wherein the outlet outputs at least one of ions and excited gases generated by the plasma to a process chamber.

38. A method for exciting gases with an inductively-coupled plasma source comprising:
 a. generating an alternating magnetic field unidirectionally through a magnetic core defining a gap, across the gap and through a plasma vessel comprising a dielectric material;
 b. inducing an electric field in the plasma vessel; and
 c. generating a plasma.

39. The method of claim 38, comprising inducing a current in a primary winding surrounding a portion of the magnetic core or the plasma vessel to generate the magnetic field.

40. The method of claim 39, wherein an AC power supply, an AC switching power supply or a RF power supply is used to induce the current in the primary winding.

41. The method of claim 40, wherein an impedance matching network is used to adjust a frequency of the power supply.

42. The method of claim 39, comprising minimizing capacitive coupling between the primary winding and the plasma vessel.

43. The method of claim 39, comprising measuring a parameter of the primary winding and of the plasma.

44. The method of claim 38, comprising varying a property of the electric field along a longitudinal axis of the plasma vessel.

45. The method of claim 44, wherein varying the property of the electric field comprises varying a magnitude of the electric field to maximize gas excitation in the plasma vessel.

46. The method of claim 38, comprising supplying a gas to the plasma vessel via a gas inlet.

47. The method of claim 46, comprising configuring the gas inlet to maximize stability of the plasma in the plasma vessel.

48. The method of claim 46, wherein supplying the gas to the plasma vessel comprises maximizing gas excitation in the plasma vessel.

49. The method of claim 46, wherein supplying the gas to the plasma vessel comprises directing the gas along an inner surface of a wall in the plasma vessel.

50. The method of claim 38, comprising controlling a temperature of the plasma vessel.

51. The method of claim 50, comprising positioning a cooling element in thermal communication with the plasma vessel to control the temperature of the plasma vessel.

52. The method of claim 38, comprising generating free charges in the plasma vessel.

53. The method of claim 52, wherein generating free charges comprises applying a voltage to a primary winding surrounding a magnetic core at least partially surrounding the plasma vessel.

54. The method of claim 52, wherein generating free charges comprises applying a voltage to an electrode in the plasma vessel.

55. The method of claim 52, wherein generating free charges comprises capacitively coupling an electrode to the plasma vessel.

56. The method of claim 52, wherein generating free charges comprises optically coupling an ultraviolet source to the plasma vessel.

57. The method of claim 38, comprising providing a thermal protection circuit with a network of thermal sensors and thermal switches to protect the plasma vessel and the magnetic core from overheating.

58. The method of claim 38, comprising outputting ions generated by the plasma.

59. An inductively-coupled plasma source for exciting gases comprising:

a. means for generating an alternating magnetic field unidirectionally through a magnetic core defining a gap, across the gap and through a plasma vessel comprising a dielectric material; and b. means for inducing an electric field in the plasma vessel to generate a plasma.

* * * * *